US010954406B2

(12) United States Patent
Paquet et al.

(10) Patent No.: US 10,954,406 B2
(45) Date of Patent: Mar. 23, 2021

(54) PREPARATION OF HIGH CONDUCTIVITY COPPER FILMS (71) Applicant: National Research Council of Canada, Ottawa (CA)

(72) Inventors: Chantal Paquet, Carp (CA); Thomas Lacelle, Kanata (CA); Patrick R. L. Malenfant, Orleans (CA)

( * ) Notice: Subject to any disclaimer, the term of this patent is extended or adjusted under 35 U.S.C. 154(b) by 452 days.

(21) Appl. No.: 15/835,688

(22) PCT Filed: Feb. 2, 2016

(86) PCT No.: PCT/CA2016/050091
§ 371 (c)(1),
(2) Date: Dec. 8, 2017

(87) PCT Pub. No.: WO2016/197234
PCT Pub. Date: Dec. 15, 2016

(65) Prior Publication Data
US 2018/0134909 A1   May 17, 2018

Related U.S. Application Data (60) Provisional application No. 62/174,426, filed on Jun. 11, 2015.

(51) Int. Cl.
| C09D 11/52 | (2014.01) |
| H05K 1/09 | (2006.01) |
| H05K 3/12 | (2006.01) |
| C09D 11/037 | (2014.01) |
| C09D 11/033 | (2014.01) |
| C09D 11/36 | (2014.01) |
| H05K 1/03 | (2006.01) |
| C09D 11/322 | (2014.01) |
| C09D 11/32 | (2014.01) |
| C08J 7/06 | (2006.01) |
| B29C 71/02 | (2006.01) |

(52) U.S. Cl.
CPC .............. C09D 11/52 (2013.01); C08J 7/065 (2013.01); C08J 7/08 (2013.01); C09D 11/033 (2013.01); C09D 11/037 (2013.01); C09D 11/32 (2013.01); C09D 11/36 (2013.01); H05K 1/097 (2013.01); H05K 3/1283 (2013.01); C08J 2379/08 (2013.01); H05K 1/0393 (2013.01); H05K 2201/0145 (2013.01); H05K 2201/0154 (2013.01); H05K 2201/0158 (2013.01); H05K 2201/0162 (2013.01)

(58) Field of Classification Search
None
See application file for complete search history.

(56) References Cited

U.S. PATENT DOCUMENTS

| 5,980,622 | A | 11/1999 | Byers |
| 6,521,032 | B1 | 2/2003 | Lehmann et al. |
| 6,770,122 | B2 | 8/2004 | Thompson |
| 7,473,307 | B2 | 1/2009 | Song et al. |
| 8,262,894 | B2 | 9/2012 | Xu et al. |
| 2003/0180451 | A1* | 9/2003 | Kodas ............... H05K 3/105 427/123 |
| 2008/0178761 | A1 | 7/2008 | Tomotake et al. |
| 2012/0114521 | A1* | 5/2012 | Zinn ................. B22F 1/0062 420/469 |
| 2014/0349017 | A1* | 11/2014 | Abe .................... H01B 1/22 427/383.1 |
| 2015/0056426 | A1* | 2/2015 | Grouchko .......... C09D 11/52 428/208 |
| 2015/0189748 | A1* | 7/2015 | Iida ..................... B05D 1/30 428/209 |
| 2015/0336878 | A1* | 11/2015 | Cho .................... B05D 3/007 252/519.2 |
| 2016/0057866 | A1* | 2/2016 | Shimoda ............. C08K 5/07 174/257 |

(Continued)

FOREIGN PATENT DOCUMENTS

| CN | 1071182 A | 4/1993 |
| CN | 101519356 A | 9/2009 |

(Continued)

OTHER PUBLICATIONS

English translation of JP 2013/178983, Sep. 2013; 22 pages.*
English translation of KR 2014/0142406, Dec. 2014; 19 pages.*
English translation of KR 2012/0036476, Apr. 2012; 14 pages.*
English translation of CN 104341860, Feb. 2015; 20 pages.*
Office Action dated Dec. 24, 2019 on Chinese application 201680032492.X.
Office Action and Search Report dated May 2019 on Taiwan application 10510406.

(Continued)

Primary Examiner — Helene Klemanski
(74) Attorney, Agent, or Firm — Brunet & Co., Ltd.; Hans Koenig; Robert Brunet (57) ABSTRACT A copper precursor composition contains: a first copper complex of an imine or a first cyclic amine coordinated to a first copper precursor compound; and, a second copper complex of a primary amine or a second cyclic amine coordinated to a second copper precursor compound. A copper precursor composition contains a copper complex of an imine coordinated to a copper precursor compound. The copper precursor composition is thermally degradable at a temperature lower than a comparable composition containing only primary amine copper complexes under otherwise the same conditions to produce a metallic copper film having a resistivity of about 200 μΩ-cm or less. Inks containing the copper precursor composition and a solvent may be deposited on a substrate and sintered to produce a metallic copper film. The substrate with the film thereon is useful in electronic devices.

23 Claims, 4 Drawing Sheets

(56) References Cited

U.S. PATENT DOCUMENTS

| | | | |
|---|---|---|---|
| 2016/0081189 A1* | 3/2016 | Shimoda | C03C 17/10 |
| | | | 428/209 |
| 2017/0130084 A1* | 5/2017 | Kell | C09D 11/14 |
| 2019/0284422 A1* | 9/2019 | Liu | B64D 15/12 |

FOREIGN PATENT DOCUMENTS

| | | | |
|---|---|---|---|
| CN | 104341860 A | * | 2/2015 |
| CN | 104471108 A | | 3/2015 |
| EP | 0335237 A2 | | 10/1989 |
| GB | 1443099 A | | 7/1976 |
| JP | H10279868 A | | 10/1998 |
| JP | 2000/136333 A | | 5/2000 |
| JP | 2004/162110 A | | 6/2004 |
| JP | 2009/256218 A | | 11/2009 |
| JP | 2013/178983 A | * | 9/2013 |
| JP | 2015/187259 A | | 10/2015 |
| KR | 2012/0036476 A | * | 4/2012 |
| KR | 2014/0142406 A | * | 12/2014 |
| KR | 20150085332 A | | 7/2015 |
| TW | 201406991 A | | 2/2014 |
| TW | 201437299 A | | 10/2014 |
| WO | 03/095701 A1 | | 11/2003 |
| WO | 2003/095701 A1 | | 11/2003 |
| WO | 2004/035691 A1 | | 4/2004 |
| WO | 2006/093398 A1 | | 9/2006 |
| WO | 2014/010328 A1 | | 1/2014 |
| WO | 2015/012209 A1 | | 1/2015 |
| WO | 2015/192248 A1 | | 12/2015 |

OTHER PUBLICATIONS

International Search Report and Written Opinion dated Apr. 25, 2016 on PCT/CA2016/050091.
Araki T, Sugahara T, Jiu J, Nagao S, Nogi M, Koga H, Uchida H, Shinozaki K, Suganuma K. (2013) Cu Salt Ink Formulation for Printed Electronics using Photonic Sintering. Langmuir. 29(35), 11192-11197.
Choi Y-H, Lee J, Kim SJ, Yeon D-H, Byun Y. (2012) Highly conductive polymer-decorated Cu electrode films printed on glass substrates with novel precursor-based inks and pastes. J. Mater Chem. 22, 3624-3631.
Farraj Y, Grouchko M, Magdassi S. (2015) Self-reduction of a copper complex MOD ink for inkjet printing conductive patterns on plastics. Chem. Comm. 51, 1587-1590.
Hwang J, Kim S, Ayag KR, Kim H. (2014) Copper Electrode Material using Copper Formate-Bicarbonate Complex for Printed Electronics. Bull. Korean Chem. Soc. 35(1), 147-150.
Kamyshny A, Steinke J, Magdassi S. (2011) Metal-based Inks for Printed Electronics. Yje Open Applied Physics Journal. 4, 19-36.
Kim I, Kim Y, Woo K, Ryu E-H, Yon K-Y, Cao G, Moon J. (2013) Synthesis of oxidation-resistant core-shell copper nanoparticles. RSC Adv. 3, 15169-15177.
Lyons AM, Nakahara S, Marcus MA, Pearce EM, Waszczak JV. (1991) Preparation of copper poly(2-vinylpyridine) nanocomposites. J. Phys Chem. 95(3), 1098-1105.
Park K-H, Marshall WJ. (2005) Remarkably Volatile Copper (II) Complexes of N,N'-Unsymmetrically Substituted 1,3-Diketimines as Precursors for Cu Metal Deposition via CVD or ALD. JAGS. 127, 9330-9331.
Shin D-H, Woo S, Yem H, Cha M, Cho S, Kang M, Jeong S, Kim Y, Kang K, Piao Y. (2014) A Self-Reducible and Alcohol-Soluble Copper-Based Metal-Organic Decomposition Ink for Printed Electronics. ACS Appl. Mater. Interfaces. 6(5), 3312-3319.
Yabuki A, Arriffin N, Yanase M. (2011) Low-temperature synthesis of copper conductive film by thermal decomposition of copper-amine complexes. Thin Solid Films. 519, 6530-6533.
Yabuki A, Tanaka S. (2012) Electrically conductive copper film prepared at low temperature by thermal decomposition of copper amine complexes with various amines. Mater Res. Bull. 47(12), 4107-4111.
Yabuki A, Tachibana Y, Fathona IW. (2014) Synthesis of copper conductive film by low-temperature thermal decomposition of copper-aminediol complexes under an air atmosphere. Mater Chem. & Phys. 148(1-2), 299-304.
Supplementary European Search Report dated Jan. 4, 2019 on European Application 16806465.7.
Office Action dated Dec. 17, 2019 on Japanese application 2017-563208.
Office Action dated Feb. 19, 2020 on Indian application 201827000898.
Office Action dated Sep. 2, 2020 on Chinese application 201680032492.

* cited by examiner

PREPARATION OF HIGH CONDUCTIVITY COPPER FILMS

CROSS-REFERENCE TO RELATED APPLICATIONS

This application is a national entry of International Patent Application PCT/CA2016/050091 filed Feb. 2, 2016 and claims the benefit of United States Provisional Patent Applications U.S. Ser. No. 62/174,426 filed Jun. 11, 2015, the entire contents of both of which are herein incorporated by reference

FIELD

This application relates to processes and compositions for preparing high conductivity copper films on substrates, especially for use in flexible circuits.

BACKGROUND

The production of low cost electronics relies on the ability to print conductive circuits using additive printing techniques on inexpensive plastic substrates. Formulating conductive inks that function with low cost printing techniques, such as inkjet, screen, flexo or gravure printing, while providing the required electrical and mechanical performance is still a challenge in printable electronics as smaller dimensions and high density will enable new applications. Although flake-based silver conductive inks meet many of today's requirements and silver nanoparticles inks have promise due to their excellent electrical properties, few options exist for cost effective inks based on copper despite their superiority with regards to electromigration, which plagues silver circuits and will become increasingly important as higher density designs become implemented.

Thermal decomposition of anhydrous copper (II) formate ($Cu(OOCH)_2$) has been shown to occur near 200° C. yielding $Cu^0$, $H_2$ and $CO_2$ in a stepwise cation reduction reaction with copper (I) formate as an intermediate. Copper coordination compounds are compelling ink materials as they are inexpensive, easy to prepare and process, compatible with a range of different printing methods and have excellent electrical performance. For instance, copper (II) formate coordinated to alkylamines, such as hexylamine and octylamine, convert to metallic copper by thermal decomposition under relatively mild conditions providing metallic copper traces with resistivity values as low as 5.0 µΩ·cm. Unfortunately, the sintering conditions typically used all cause polyethylene terephthalate (PET) to deform, especially under tension, thereby limiting their use. In addition, the sintering times on the order of 30 min lessens their appeal in a roll-to-roll process. PET is an inexpensive substrate desirable for the fabrication of low cost electronics using with screen or inkjet printing.

Copper formates coordinated with pyridine derivatives have been used as precursors for metallic copper (U.S. Pat. No. 6,770,122). Copper formates coordinated with piperidine derivatives have been used as precursors for metallic copper (US 2014/0349017). However, these documents do not demonstrate utility to make printable inks that can also be sintered at low temperatures, in less time and at ambient pressure compatible with PET to produce copper films of low resistivity.

SUMMARY

There is provided a copper precursor composition comprising: a first copper complex comprising an imine or a first cyclic amine coordinated to a first copper precursor compound; and, a second copper complex comprising a primary amine or a second cyclic amine coordinated to a second copper precursor compound, the copper precursor composition thermally degradable at a temperature lower than a comparable composition comprising only the second copper complex under otherwise the same conditions to produce a metallic copper film having a resistivity of about 200 µΩ·cm or less.

There is further provided a copper precursor composition comprising a copper complex comprising an imine coordinated to a copper precursor compound.

There is further provided a copper ink comprising a copper precursor composition as described above and a solvent.

There is further provided a substrate comprising a trace of the copper ink deposited on a surface of the substrate.

There is further provided a process for producing a metallic copper film comprising: depositing the copper ink on a surface of a substrate; and, sintering the ink to produce a metallic copper film.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which.

DETAILED DESCRIPTION

In one embodiment, the copper precursor composition comprises a first copper complex comprising an imine or a first cyclic amine coordinated to a first copper precursor compound, and a second copper complex comprising a primary amine or a second cyclic amine coordinated to a second copper precursor compound. Preferably, the first copper complex comprises: two cyclic amines, which may be the same or different, preferably the same; two imines, which may be the same or different, preferably the same; or, one cyclic amine and one imine. Preferably, the second copper complex comprises: two primary amines, which may be the same or different, preferably the same; two cyclic amines, which may be the same or different, preferably the same; or, one primary amine and one cyclic amine. The first and second copper complexes are different complexes.

In another embodiment, the copper precursor composition comprises a copper complex comprising an imine coordinated to a copper precursor compound.

Cyclic amines comprise a ring structure comprising one or more nitrogen atoms in the ring. The ring may contain, for example, 1, 2 or 3 nitrogen atoms. At least one of the nitrogen atoms should be available for coordination to copper. Preferably, the ring contains 1 or 2 nitrogen atoms, more preferably 1 nitrogen atom. The ring also contains at least one carbon atom, preferably 1-7 carbon atoms. The ring may also contain one or more heteroatoms, for example O or S. Preferably, the ring comprises only nitrogen and carbon atoms. Preferably, the cyclic amine comprises a 4-membered ring, a 5-membered ring, a 6-membered ring, a 7-membered ring or an 8-membered ring. 5-membered rings, 6-membered rings and 7-membered rings are especially preferred. 6-membered rings are most preferred. The cyclic amine may comprise one or more ring structures, where the ring structures are fused or unfused. At least one of the ring structures contains a nitrogen atom, whereas the other ring structures may or may not contain a nitrogen atom. The ring structures may be aromatic or non-aromatic.

The rings may be unsubstituted or substituted with one or more substituents. Substituents may include, for example, hydrogen, halogen, hydroxyl, sulfhydryl, carboxyl, substituted carboxyl, alkyl, substituted alkyl, alkenyl, substituted alkenyl, alkynyl and substituted alkynyl. Substituted substituents may be substituted with one or substituents, which may be the same as those listed above. Preferably, the substituents comprise alkyl, substituted alkyl, alkenyl, substituted alkenyl, alkynyl or substituted alkynyl. Substituents on the rings are preferred in some embodiments because substituents on the rings may help the first copper complex be more compatible with the second copper complex. In this regard, the substituents on the rings of the first copper complex preferably have similar solubility properties as the organic groups that form part of the primary amines or cyclic amines of the second copper complex. Compatibilzation of the first and second copper complexes may reduce a tendency for one or the other of the copper complexes to crystallize.

The cyclic amine preferably comprises from 1 to 30 carbon atoms and from 1 to 3 nitrogen atoms. The cyclic amine more preferably comprises from 4 to 20 carbon atoms. The cyclic amine more preferably comprises 1 nitrogen atom, which is in the ring structure and available for coordination to the copper of the first copper precursor compound. Preferably, the ring structure in the cyclic amine comprises from 4 to 6 carbon atoms. Any substituents on the ring structure preferably each comprise from 1 to 8 carbon atoms. Preferably, the ring structures comprise from 1 to 3 substituents other than hydrogen. Preferably there is 1 ring structure in the cyclic amine.

Some examples of nitrogen-containing ring structures include unsubstituted or substituted aziridine, diazine, azetidine, dihydroazete, diazetidine, pyrrolidine, pyrrole, imidazolidine, pyrazolidine, imidazole, pyrazoline, pyrazole, triazole, tetrazole, piperidine, pyridine, tetrahydropyran, pyran, piperazine, pyrazine, pyrimidine, pyridazine, morpholine, triazine, azepane, azepine, homopiperazine, diazepine, azocane, azocine and structural isomers thereof. Pyridine and piperidine are particularly preferred.

Other than hydrogen, substituents on the ring structures preferably include $C_{1-8}$ alkyl groups, $C_{2-8}$ alkenyl groups and $C_{2-8}$ alkynyl groups. $C_{1-8}$ alkyl groups are more preferred. $C_{1-8}$ alkyl groups include, for example, methyl, ethyl, n-propyl, i-propyl, n-butyl, sec-butyl, tert-butyl, pentyl, hexyl, heptyl, octyl and isomers thereof.

Of particular note are alkyl-substituted pyridines and piperidines. One or more alkyl groups may be substituted on the pyridine or piperidine ring. Preferably, there are from 1 to 3 alkyl substituents, more preferably 1 or 2 alkyl substituents. The alkyl substituents are preferably $C_{1-8}$ alkyl groups.

Imines contain at least one nitrogen atom that coordinates to copper. Imines of Formula (I) are preferred:

where $R_1$, $R_2$ and $R_3$ are the same or different and may be H, alkyl (e.g. $C_{1-8}$ alkyl), alkenyl (e.g. $C_{2-8}$ alkenyl), alkynyl (e.g. $C_{2-8}$ alkynyl), cycloalkyl (e.g. $C_{3-8}$ cycloalkyl), aryl (e.g. $C_{6-14}$ aryl), alkaryl (e.g. $C_{7-20}$ alkaryl), aralkyl (e.g. $C_{7-20}$ aralkyl), OH, O-alkyl (e.g. O—$C_{1-8}$ alkyl), O-aralkyl (e.g. O—$C_{7-20}$ aralkyl), O-alkaryl (e.g. O—$C_{7-20}$ alkaryl), $CO_2$-alkyl (e.g. $CO_2$—($C_{1-8}$ alkyl)), $SO_2$-alkyl (e.g. $SO_2$—($C_{1-8}$ alkyl)) or SO-alkyl (e.g. SO—($C_{1-8}$ alkyl)) or $R_1$ and $R_2$ taken together form a ring (e.g. a $C_3$-$C_8$ ring), with the proviso that at least one of $R_1$, $R_2$ and $R_3$ is not H.

In $R_1$, $R_2$ and $R_3$, alkyl groups include, for example, methyl, ethyl, n-propyl, i-propyl, n-butyl, sec-butyl, tert-butyl, pentyl, hexyl, heptyl, octyl and isomers thereof. Aryl groups include, for example, phenyl, naphthyl and anthracyl. Cycloalkyl groups include, for example, cyclopropyl, cyclobutyl, cyclopentyl, cycohexyl, cycloheptyl and cyclooctyl. Aralkyl groups include, for example ($C_{6-14}$ aryl)($C_{1-4}$ alkyl)$_x$, where x is 1-3. Alkaryl groups include, for example, ($C_{1-4}$ alkyl)($C_{6-14}$ aryl).

Cyclic imines are of particular note. Some examples of cyclic imines are unsubstituted and substituted azirine, azete and pyrroline.

Primary amines of the formula R—$NH_2$ are preferred, where R is an organic group. R is preferably a $C_3$-$C_{20}$ organic group, more preferably a $C_6$-$C_{12}$ organic group. The organic group is preferably an unsubstituted alkyl group, an unsubstituted alkenyl group or an unsubstituted alkynyl group, more preferably an unsubstituted alkyl group. The unsubstituted alkyl, alkenyl or alkynyl groups are preferably straight or branched chains. Some particular examples of primary amines include hexylamine, octylamine and ethylhexylamine.

Copper precursor compounds comprise a copper ion, preferably a copper (II) ion, and one or more ligands coordinated to the copper ion. The one or more ligands may be any ligand which is removable from the copper ion by the action of heat. Suitable ligands for copper precursor compounds are known in the art. Some examples of suitable ligands include organic or inorganic ligands that bind to the copper through an atom other than carbon such as oxygen, nitrogen, sulfur and halogen. A combination comprising at least one of the foregoing can be used. Inorganic ligands include, for example, nitrate, carbonate, halide, perchlorate, hydroxide and tetrafluoroborate. Organic ligands include, for example, carboxylates, sulfonates and amides. Preferably, there are two ligands coordinated to the copper precursor compounds. The two ligands may be the same or different, preferably the same. The one or more ligands preferably comprise carboxylate anions, for example, formate, acetate, oxalate, propionate, butanoate, ethylhexanoate, neodecanoate, pentafluoropropionate, citrate, glycolate, benzoate, trifluoroacetate, phenylacetate, acetylacetonate and hexafluoroacetyl-acetonate groups. $C_{1-12}$ alkanoates are particularly preferred. Formate is most preferred. The first and second copper precursor compounds may be the same or different, preferably the same.

Copper complexes may be prepared by reacting cyclic amine, imine or primary amine, as the case may be, with the copper precursor compound. The copper precursor compound may comprise one or more coordinated leaving groups (e.g. water, ammonia and the like), which are displaced by the cyclic amine, imine or primary amine during the reaction. The reaction may be conducted in a solvent, preferably a solvent that facilitates the displacement of the leaving group while not out-competing the cyclic amine, imine or primary amine for coordination to the copper. Such solvents are well known in the art, for example acetonitrile, dimethyl sulfoxide (DMSO), tetrahydrofuran (THF) and the like. In some cases the reaction may be performed at elevated temperatures to assist in the displacement of the leaving group. The amount of cyclic amine, imine or primary amine depends on the number of such molecules to be coordinated to the copper. Using two molar equivalents of cyclic amine, imine or primary amine with one molar equivalent of copper precursor compound permits coordination of two molecules of the cyclic amine, imine or primary amine to the copper.

The amount of the first copper complex and second copper complex in a copper precursor composition may be adjusted by simple experimentation to determine the best ratio of one to the other depending on the nature of the first and second copper complexes. The amount (w/w) of the first copper complex with respect to the second copper complex may be in the range of about 1-99% based on total weight of the first and second copper complexes, preferably about 5-95%, more preferably about 10-75%, or about 20-75%, or about 40-75%, or about 50-75%, or about 60-66%.

The copper ink comprises a solvent in addition to the copper precursor composition. The copper precursor composition may comprise about 1-99 wt % of the ink, based on weight of the ink. Preferably, the copper precursor composition comprises about 5-95 wt %, or about 10-90 wt %, or about 20-80 wt % of the ink. The solvent generally makes up the balance of the ink after considering all other components including the copper precursor composition, any binders that are present and any other component. The balance may be, in some instances, about 1-99 wt %, based on weight of the ink. The solvent preferably comprises about 5-95 wt %, or about 15-95 wt %, or about 20-75 wt %, or about 20-40 wt % of the ink.

The solvent may comprise an aqueous medium, an organic medium or a mixture thereof. Aqueous media comprise water or water with one or more other ingredients dispersed therein. Organic media may comprise an organic solvent or mixture of organic solvents. The copper precursor composition is preferably dispersable, more preferably soluble, in the solvent.

Organic solvents include, for example, alcohol-based solvents, diol-based solvents, ketone-based solvents, ester-based solvents, ether-based solvents, aliphatic or alicyclic hydrocarbon-based solvents, aromatic hydrocarbon-based solvents, cyano-containing hydrocarbon solvents, and other solvents.

Alcohol-based solvents include, for example, methanol, ethanol, propanol, isopropanol, 1-butanol, isobutanol, 2-butanol, tertiary butanol, pentanol, isopentanol, 2-pentanol, neopentanol, tertiary pentanol, hexanol, 2-hexanol, heptanol, 2-heptanol, octanol, 2-ethylhexanol, 2-octanol, cyclopentanol, cyclohexanol, cycloheptanol, methylcyclopentanol, methylcyclohexanol, methylcycloheptanol, benzyl alcohol, ethylene glycol monoacetate, ethylene glycol monoethyl ether, ethylene glycol monophenyl ether, ethylene glycol monobutyl ether, ethylene glycol monomethyl ether, propylene glycol monomethyl ether, propylene glycol monoethyl ether, diethylene glycol monomethyl ether, diethylene glycol monoethyl ether, dipropylene glycol monomethyl ether, dipropylene glycol monoethyl ether, dipropylene glycol monobutyl ether, 2-(2-methoxyethoxy)ethanol, 2-(N,N-dimethylamino)ethanol, 3-(N,N-dimethylamino)propanol, and the like.

Diol-based solvents include, for example, ethylene glycol, propylene glycol, 1,2-butanediol, 1,3-butanediol, 1,4-butanediol, 1,5-pentanediol, neopentyl glycol, isoprene glycol (3-methyl-1,3-butanediol), 1,2-hexanediol, 1,6-hexanediol, 3-methyl-1,5-pentanediol, 1,2-octanediol, octanediol (2-ethyl-1,3-hexanediol), 2-butyl-2-ethyl-1,3-propanediol, 2.5-dimethyl-2.5-hexanedioL 1,2-cyclohexanediol, 1,4-cyclohexanediol, 1,4-cyclohexanedimethanol, and the like.

Ketone-based solvents include, for example, acetone, ethyl methyl ketone, methyl butyl ketone, methyl isobutyl ketone, ethyl butyl ketone, dipropyl ketone, diisobutyl ketone, methyl amyl ketone, cyclohexanone, methylcyclohexanone, and the like.

Ester-based solvents include, for example, methylformate, ethyl formate, methyl acetate, ethyl acetate, isopropyl acetate, butyl acetate, isobutyl acetate, sec-butyl acetate, tert-butyl acetate, amyl acetate, isoamyl acetate, tert-amyl acetate, phenyl acetate, methyl propionate, ethyl propionate, isopropyl propionate, butyl propionate, isobutyl propionate, sec-butyl propionate, tert-butyl propionate, amyl propionate, isoamyl propionate, tert-amyl propionate, phenyl propionate, methyl 2-ethylhexanoate, ethyl 2-ethylhexanoate, propyl 2-ethylhexanoate, isopropyl 2-ethylhexanoate, butyl 2-ethylhexanoate, methyl lactate, ethyl lactate, methyl methoxypropionate, methyl ethoxypropionate, ethyl methoxypropionate, ethyl ethoxypropionate, ethylene glycol monomethyl ether acetate, diethylene glycol monomethyl ether acetate, ethylene glycol monoethyl ether acetate, ethylene glycol monopropyl ether acetate, ethylene glycol monoisopropyl ether acetate, ethylene glycol monobutyl ether acetate, ethylene glycol mono-sec-butyl ether acetate, ethylene glycol monoisobutyl ether acetate, ethylene glycol mono-tert-butyl ether acetate, propylene glycol monomethyl ether acetate, propylene glycol monoethyl ether acetate, propylene glycol monopropyl ether acetate, propylene glycol monoisopropyl ether acetate, propylene glycol monobutyl ether acetate, propylene glycol mono-sec-butyl ether acetate, propylene glycol monoisobutyl ether acetate, propylene glycol mono-tert-butyl ether acetate, butylene glycol monomethyl ether acetate, butylene glycol monoethyl ether acetate, butylene glycol monopropyl ether acetate, butylene glycol monoisopropyl ether acetate, butylene glycol monobutyl ether acetate, butylene glycol mono-sec-butyl ether acetate, butylene glycol monoisobutyl ether acetate, butylene glycol mono-tert-butyl ether acetate, methyl acetoacctatc, ethyl acetoacetate, methyl oxobutanoate, ethyl oxobutanoate, γ-lactone, ο-lactone, and the like.

Ether-based solvents include, for example, tetrahydrofuran, tetrahydropyran, morpholine, ethylene glycol dimethyl ether, diethylene glycol dimethyl ether, triethylene glycol dimethyl ether, dibutyl ether, diethyl ether, dioxane, and the like.

Aliphatic or alicyclic hydrocarbon solvents include, for example, pentane, hexane, cyclohexane, methylcyclohexane, dimethylcyclohexane, ethylcyclohexane, heptane, octane, decaline, solvent naphtha, and the like.

Aromatic hydrocarbon-based solvents include, for example, benzene, toluene, ethylbenzene, xylene, trimethylbenzenes (e.g. mesitylene), diethylbenzene, cumene, isobutylbenzene, cymene, tetralin, chlorobenzene, benzyl ether, anisole, benzonitrile, propylbenzene, cumene, isobutylbenzene, indane, tetralin, durene, indane, and the like.

Cyano-containing hydrocarbon solvents include, for example, include 1-cyanopropane, 1-cyano butane, 1-cyanohexane, cyanocyclohexane, cyanobenzene, 1,3-dicyanopropane, 1,4-dicyanobutane, 1,6-dicyanohexane, 1,4-dicyanocyclohexane, 1,4-dicyanobenzene, and the like.

In some embodiments, the solvent may be the same as the amines or imines used to form the copper complexes.

The copper ink may also comprise a binder. A binder is any material that binds the ink together into a film and binds the ink to a surface on which the ink is deposited. The binder preferably comprises a polymeric material, especially an organic polymer. The amount of binder may be expressed in terms of the total mass of the copper in the copper precursor composition. Preferably, the binder may be present in the ink in a range of about 2.5-55 wt % based on weight of the copper in the copper precursor composition. Weight of the copper in the copper precursor composition is the total weight of the copper without the other elements that comprise the precursor composition. More preferably, the binder is in a range of about 5-35 wt % based on weight of the copper in the copper precursor composition. The binder preferably comprises an organic polymeric binder, for example, ethyl cellulose, polypyrrolidone, epoxies, phenolic resins, phenol formaldehyde resins (e.g. Novolac™, Resole™), acrylics, urethanes, silicones, styrene allyl alcohols, polyalkylene carbonates, polyvinyl acetals, polyesters, polyurethanes, polyolefins, fluoroplastics, fluoroelastomers, thermoplastic elastomers or any mixture thereof.

The substrate may be any surface on to which the ink may be deposited, preferably any printable surface. Surfaces may comprise, for example, polyethylene terephthalate (PET), polyolefin (e.g. silica-filled polyolefin (Teslin™)), polyethylene naphthalate (PEN), polydimethylsiloxane (PDMS), polystyrene, polycarbonate (PC), polyimide (e.g. Kapton™), silicone membranes, epoxy resin (e.g. glass-reinforced epoxy resin laminate), textiles (e.g. cellulosic textiles), paper, glass, metal, dielectric coatings, among others. Plastic substrates are preferred. Flexible substrates are preferred. Polyethylene terephthalate, polyethylene naphthalate, polycarbonate and FR-4 (glass-reinforced epoxy resin laminate) are preferred, especially polyethylene terephthalate, polyethylene naphthalate and FR-4. Polyethylene terephthalate (PET) is of particular note.

Inks may be deposited on a substrate by any suitable method, for example screen printing, inkjet printing, flexography printing (e.g. stamps), gravure printing, off-set printing, airbrushing, aerosol printing, typesetting, spin coating, dip coating spray coating, roll coating, knife coating, bar coating, slit coating, brush coating or any other method. Printing methods are preferred. After deposition, the ink may be dried or cured, for example by allowing the ink to dry in ambient conditions or heating the ink for an appropriately long period of time to evaporate the solvent. The inks of the present invention are particularly suited to inkjet, screen, roll-to-roll, flexography or gravure printing. The inks are well-suited for roll-to-roll printing as they require lower temperature and less time to sinter.

The ink may be deposited, for example printed, onto a substrate to form a trace of the ink on the substrate. Drying and decomposing the trace to form conductive copper films may be accomplished by any suitable technique, where the techniques and conditions are guided by the type of substrate on which the ink traces are deposited. Heating the substrate dries and sinters the trace to form a conductive copper film. Sintering decomposes the copper precursor composition to form conductive copper nanoparticles. Heating is preferably performed at a temperature of about 150° C. or less, or about 140° C. or less, or about 135° C. or less, or about 130° C. or less, or about 125° C. or less. Heating is preferably performed at a temperature of about 90° C. or more, or about 100° C. or more. The ink trace is preferably sintered for a time of about 30 min or less, or about 10 min or less, or about 5 min or less. There is a balance between temperature and time whereby sintering at lower temperature generally requires a longer time. Pressure may also be adjusted during sintering to alter the temperature and/or time required to form conductive copper films. The pressure is preferably about 3 atm or less, or about 2 atm or less. In one embodiment, no additional pressure is used. The type of heating apparatus also factors into the temperature and time required for sintering. Sintering may be performed with the substrate under an oxidizing atmosphere (e.g. air) or an inert atmosphere (e.g. nitrogen and/or argon gas). For copper inks, an inert or a reducing atmosphere may be desired, or an oxygen depleted atmosphere having an oxygen content of preferably about 1000 ppm or less, more preferably about 500 ppm or less.

Sintering conditions (time, temperature and pressure) required for inks of the present invention may be amenable to roll-to-roll printing, a feature that was previously not possible with the primary amine coordinated copper formate complexes due to relatively long sintering times. Further, sintering conditions may be amenable for printing on PET substrates, another feature that was previously not possible with the primary amine coordinated copper formate complexes. Copper precursor compositions of the present invention reduce the temperature at which the ink needs to be sintered to produce copper films of good conductivity (low resistivity) in a short period of time.

A conductive copper film produced from the copper precursor composition preferably has a resistivity of about 150 µΩ·cm or less, or about 100 µΩ·cm or less, or even as low as 50 µΩ·cm or less. Conductive copper films may have resistivity values at least as good as currently known inks, while being produced at lower sintering temperatures in less time.

The substrate may be incorporated into an electronic device, for example electrical circuits, conductive bus bars (e.g. for photovoltaic cells), sensors, antennae (e.g. RFID antennae), touch sensors, thin film transistors and smart packaging (e.g. smart drug packaging). The substrates may be used as any conductive element, for example interconnectors. The copper precursor composition and inks produced therefrom enable miniaturization of such electronic devices.

EXAMPLES

Example 1: Synthesis of Amine Copper (II) Formate Complexes

Copper (II) formate complexes are prepared by coordinating 2 molar equivalents of different amines with 1 molar equivalent of copper (II) formate.

Bis(2-ethyl-1-hexylamine) copper (II) formate (EtHex) was prepared by suspending 1.0 g of copper (II) formate dihydrate in 25 mL of acetonitrile and adding 1.74 mL of 2-ethyl-1-hexylamine (a primary amine). The solution was immediately filtered to remove unreacted copper (II) formate and subsequently rotary evaporated to remove the acetonitrile.

Bis(3-butylpyridine) copper (II) formate (3ButPy) was prepared in a similar manner as primary amine copper (II) formate complexes by suspending 1.0 g of copper (II) formate dihydrate in 25 mL of acetonitrile and adding 1.57 mL of 3-butylpyridine (a pyridine). The solution was immediately filtered to remove unreacted copper formate and subsequently rotary evaporated to remove the acetonitrile.

Bis(3,5-dimethylpiperidine) copper (II) formate (DiMePip) was prepared by suspending 2 g of copper (II) formate dihydrate in 50 mL of acetonitrile and adding 2.809 mL of 3,5-dimethylpiperidine (a piperidine). The solution was immediately filtered to remove unreacted copper (II) formate and subsequently rotary evaporated to remove the acetonitrile.

Bis(octylamine) copper (II) formate (Octyl) and bis(4-t-butylpyridine) copper (II) formate (tButPy) complexes were prepared in a similar manner as described above.

Example 2: Preparation of Copper Precursor Compositions and Copper Inks

Inks of individual amine copper (II) formate complexes were prepared by mixing 1.00 g of the complex with 20%-40% (g/g) of anisole. The mixtures were homogenized by planetary mixing for 8 minutes.

Copper precursor compositions comprising a primary amine copper (II) formate complex and either a pyridine copper (II) formate complex or a piperidine copper (II) formate complex were prepared by mixing a primary amine copper (II) formate complex with either a pyridine copper (II) formate complexes or a piperidine copper (II) formate complex. The mixtures varied from 25% to 80% (g/g) of the primary amine copper (II) formate complex. Inks of the copper precursor compositions were prepared by mixing 1.00 g of the copper precursor compositions, containing the desired mixture of primary amine copper (II) formate complex and pyridine or piperidine copper (II) formate complex, with 20%-40% (g/g) of anisole. The mixtures of the copper precursor compositions and anisole were homogenized by planetary mixing for 8 minutes.

Example 3: Formation of Copper Films on Substrates

Inks prepared above were printed on Kapton™ substrates (polyimide) as squares with dimensions of 1 cm×1 cm. For inks containing pyridine copper (II) formate complexes, the inks were heated through convection using a Kar-X-Reflow 306 LF convection oven in a nitrogen atmosphere with an oxygen concentration below 200 ppm, in which the squares were heated at a temperature of 135° C. to 185° C. for 5 minutes. For inks containing piperidine copper (II) formate complexes, the inks were heated through conduction using a hotplate in a nitrogen glove box with an oxygen concentration below 1.0 ppm, where the squares were heated at a temperature of 110° C. to 150° C. for 5 minutes. For comparison, inks containing only primary amine copper (II) formate complexes were heated by both methods. Heating the inks on the substrate resulted in the formation of copper films on the substrates.

Inks comprising the alkylamine complexes, or mixtures of the alkylamine complexes and the pyridine or piperidine complexes, decomposed into films without significant cracking. However, inks comprising only tButPy and 3ButPy decomposed into films with significant cracking. As a result, electrical resistance measurements of films produced from inks comprising only tButPy and 3ButPy were unreliable. Decreasing the rate of heating and lowering the sintering temperatures did not improved the film quality for films produced from inks comprising only tButPy and 3ButPy. Inks containing a mixture of EtHex and 3ButPy combined the good film forming properties of EtHex and the low decomposition temperature of 3ButPy.

Example 4: Resistivity of Copper Traces

Resistivity values of the copper films were determined on the 1 cm×1 cm squares using a four-point probe technique. A Keithley 220 programmable current source, a HP 3478A multimeter and a SP4 tip from Lucas Lab were used for the four-point probe measurement.

Figure 1A:
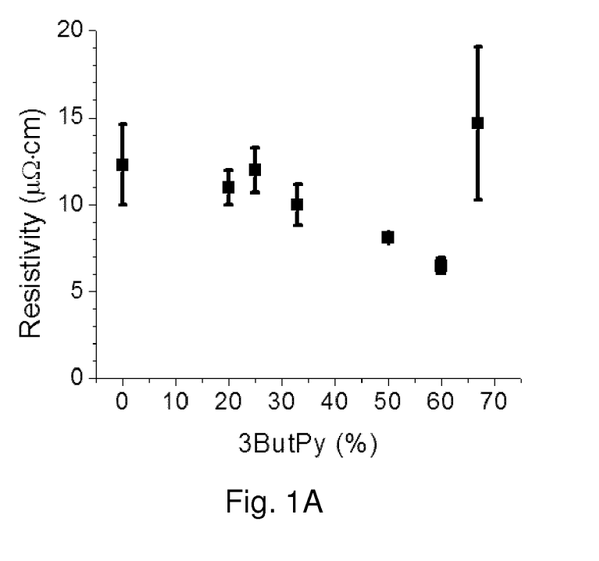
FIG. 1A depicts a graph showing resistivity (µΩ·cm) as a function of the weight fraction of 3ButPy to EtHex after heating to 170° C.
Figure 1B:
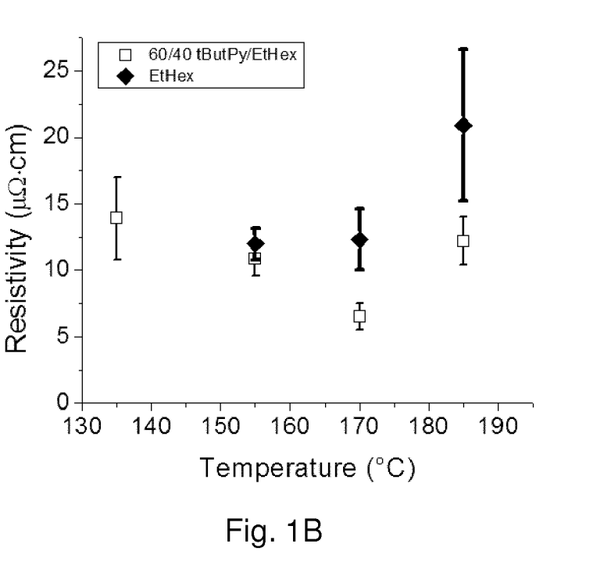
FIG. 1B depicts a graph showing resistivity (µΩ·cm) of copper films made from EtHex (black diamond) and a blend of 60% 3ButPy (white square) as a function of sintering temperature.

The optimal weight fraction of 3ButPy (e.g. 3ButPy/[3ButPy+EtHex]) was determined at about 170° C. to ensure that all blend variants were fully sintered. FIG. 1A shows that the resistivity of the films gradually decreases as the fraction of 3ButPy increases. A minimum resistivity of 6.5 µΩ·cm was achieved with 60% 3ButPy. In FIG. 1B, the resistivity values of pure EtHex complex (diamonds) are compared to a blend of 60% 3ButPy (squares) in order to assess their performance as a function of temperature. The resistivity trends lower as the sintering temperature is increased to 170° C. in both cases but increases at 185° C. concurrent with increases in the error in the resistivity values and the presence of a blackened surface. Therefore, above a sintering temperature of 170° C., oxidation plays an increasingly important role in degrading the electrical characteristics of the films. At 170° C., the 3ButPy/EtHex ink outperformed the pure EtHex ink in terms of resistivity and at 135° C. produced films with a resistivity of 13.9 µΩ·cm, whereas the EtHex derived traces were non-conductive. On examining the behavior of PET substrates under these sintering conditions, it was found that PET substrates did not show signs of deformation up to a temperature of 135° C. Table 1 illustrates substrate compatibility of EtHex and 3ButPy/EtHex inks based on resistivity values obtained by sintering 5 min at various temperatures. Table 2 illustrates the sheet resistances of copper films formed from the EtHex and 3ButPy/EtHex inks at various sintering temperatures.

TABLE 1

| Ink | Sintering T (° C.) | Resistivity (µΩ · cm) | Substrate Compatibility |
|---|---|---|---|
| EtHex | 135 | non-conductive | none |
|  | 170 | 12.3 | PEN, Kapton ™ |
| 3ButPy/EtHex (60% 3ButPy) | 135 | 13.9 | PET |
|  | 170 | 6.5 | PEN, Kapton ™ |

TABLE 2

| Ink | Sintering T (° C.) | Sheet Resistance (Ω/□) | Standard Error | Film Thickness (nm) |
|---|---|---|---|---|
| EtHex | 135 |  |  |  |
|  | 155 | 0.438 | 0.05 | 2800 |

TABLE 2-continued

| Ink | Sintering T (° C.) | Sheet Resistance (Ω/□) | Standard Error | Film Thickness (nm) |
|---|---|---|---|---|
| | 170 | 0.226 | 0.023 | 4600 |
| | 185 | 0.75 | 0.24 | 2900 |
| 3ButPy/EtHex | 135 | 0.346 | 0.031 | 4000 |
| | 155 | 0.261 | 0.013 | 4300 |
| | 170 | 0.760 | 0.057 | 5150 |
| | 185 | 0.209 | 0.048 | 6100 |

Table 3 illustrates sheet resistances (Ω/□) for copper films produced from 3ButPy/EtHex inks of varying compositions when sintered at 170° C.

TABLE 3

| 3ButPy:EtHex | Sheet Resistance (Ω/□) | Standard Error | Film Thickness (nm) |
|---|---|---|---|
| 0 | 0.0338 | 0.0024 | 4110 |
| 0.2 | 0.0263 | 0.0035 | 4380 |
| 0.25 | 0.0274 | 0.0028 | 4540 |
| 0.33 | 0.00891 | 0.0011 | 11100 |
| 0.5 | 0.0095 | 0.0006 | 8580 |
| 0.6 | 0.0076 | 0.0006 | 8700 |
| 0.67 | 0.0275 | 0.0072 | 5150 |

Figure 2:
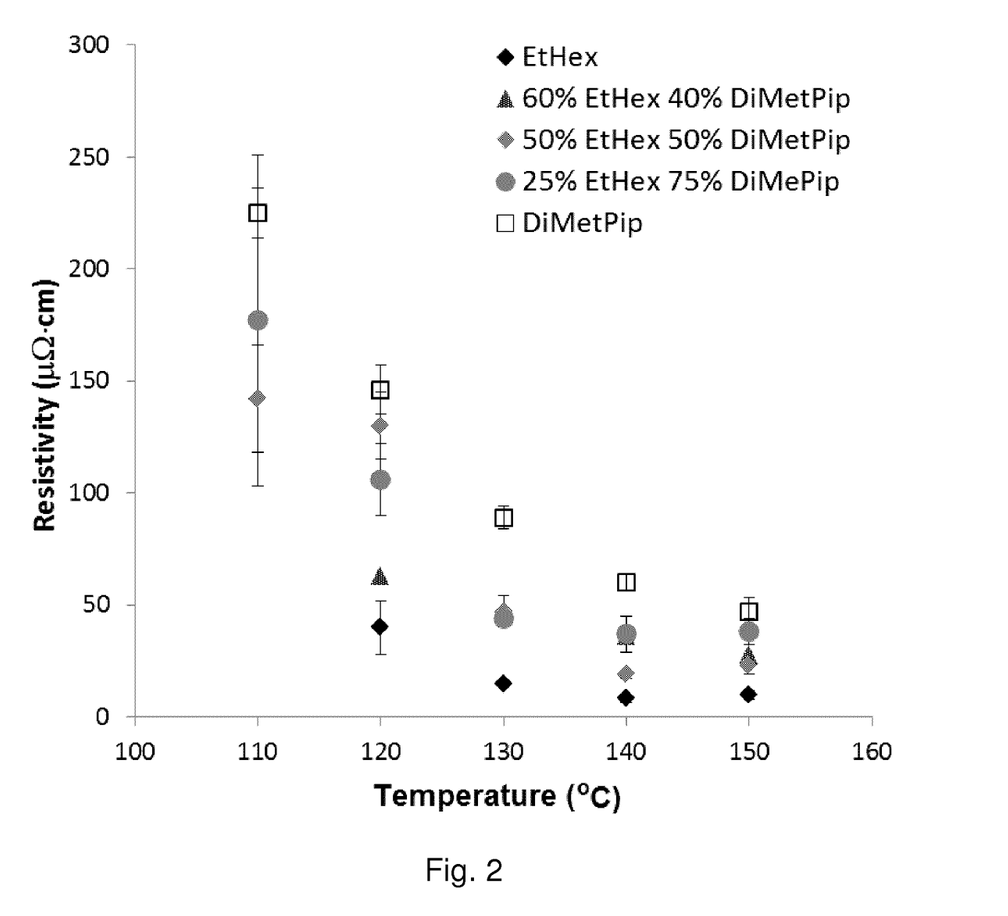
FIG. 2 depicts a graph showing resistivity (µΩ·cm) of copper films made from various DiMetPip inks and sintered between 110° C. and 150° C.

FIG. 2 shows the resistivity of copper films made from various DiMePip-containing inks as a function of temperature. The films made from pure EtHex show the lowest resistivity of all the ink mixtures but do not conduct when sintered at 110° C. Although the films made from pure DiMetPip show higher resistivity, DiMetPip and mixtures containing more than 50% DiMetPip conduct when sintered at 110° C. Thus, mixtures of DiMetPip and EtHex form conductive copper films when sintered at lower temperatures than EtHex alone and form copper films with better conductivity than films formed from DiMetPip alone. Inks with EtHex alone must be sintered at higher temperatures in order to form conductive copper films and DiMetPip alone results in copper films of lower conductivity (higher resistivity).

Example 5: Thermogravimetric Analysis of Amine Copper (II) Formate Complexes

Figure 3A:
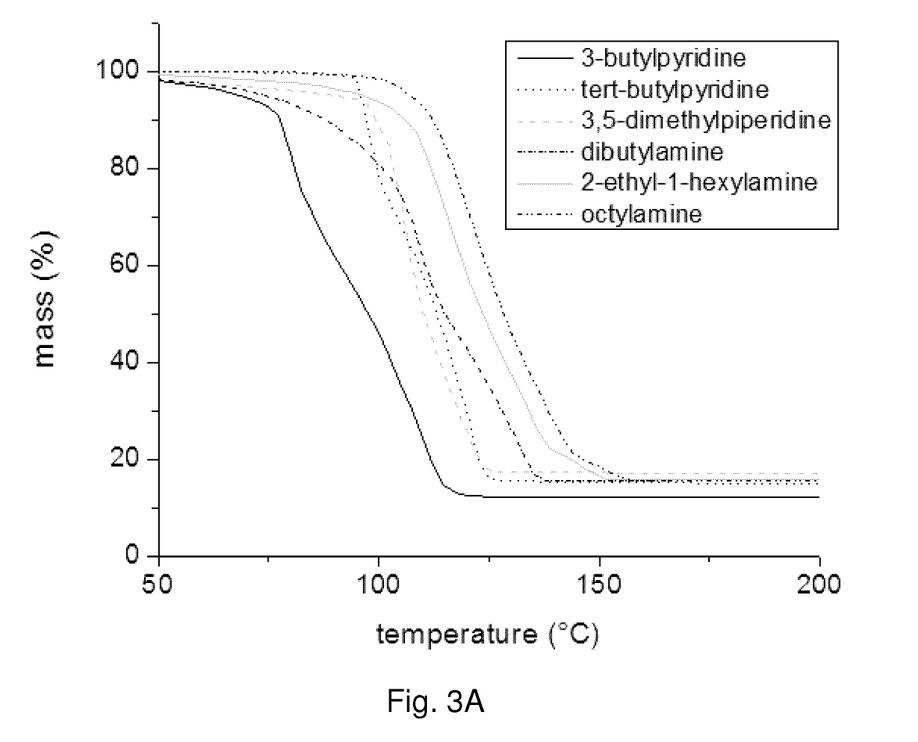
FIG. 3A depicts a graph showing TGA of copper (II) formate coordinated to various amines.
Figure 3B:
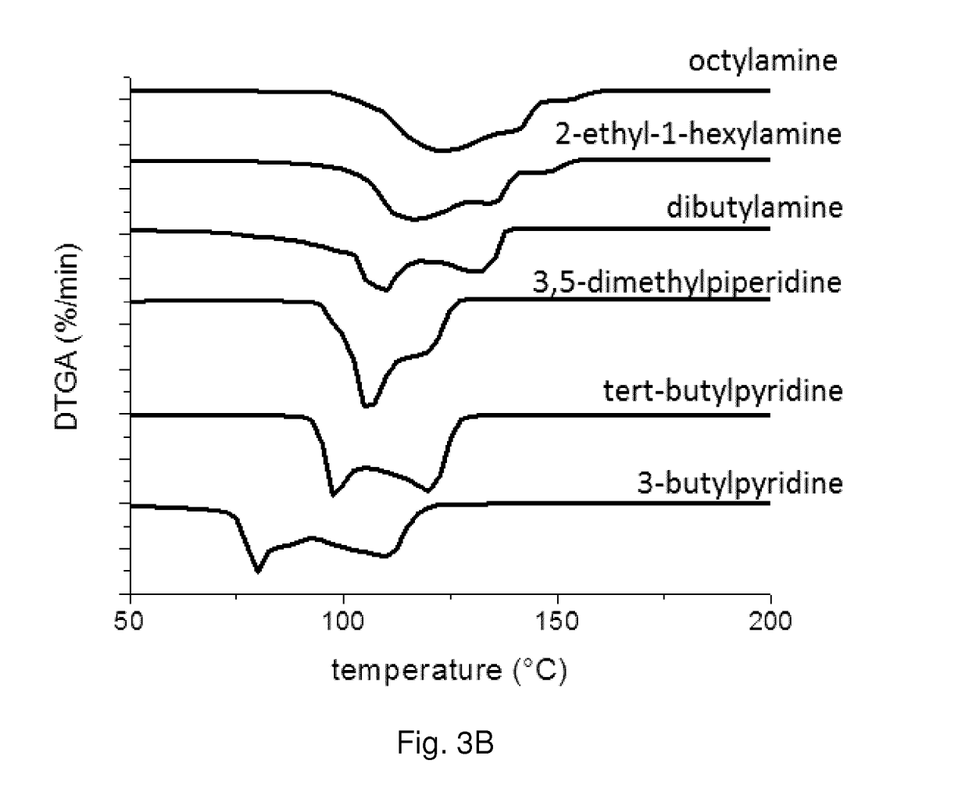
FIG. 3B depicts a graph showing DTGA of copper (II) formate coordinated to various amines.

Amine copper (II) formate complexes underwent thermogravimetry analysis (TGA) on a Netzsch TG 209 F1 Iris R. The system was run with BOC HP argon (grade 5.3) gas and residual oxygen was trapped with a Supelco Big-Supelpure oxygen/water trap. FIG. 3A and FIG. 3B show the mass loss (TGA) and derivative of the mass loss (DTGA) of the complexes as they are heated to 400° C. under Argon. The graphs show that the decomposition temperatures of the complexes decrease in the following order: primary alkylamine >secondary alkylamine >secondary cyclic alkylamine >tertiary cyclic aromatic amine.

The tButPy and 3ButPy complexes decompose between 90-130° C. and 75-120° C., respectively, whereas the mass loss of Octyl and EtHex complexes spans 100-155° C. The two peaks in mass loss point to a two-step reduction of copper complex to metallic copper. The pyridine complexes decompose within a narrower temperature range than the alkylamine complexes suggesting formation of smaller copper particles with a narrower size distribution, which was confirmed by scanning electron microscope (SEM) images of the copper films. tButPy leads to copper particles having smaller diameters and narrower size distributions (26±6 nm) than particles made from EtHex (100±30 nm) and Octyl (240±60 nm).

Pyridine and piperidine derivatives coordinated to copper (II) formate have lower decomposition temperatures than the alkylamine counterparts. The 3-butyl-pyridine ligand, coordinated to copper (II) formate, initiates decomposition near 80° C., 30° C. lower than alkylamine-Cu(OOCH)$_2$ derivatives. Although on its own bis(3-butyl-pyridine) copper (II) formate has poor film forming properties, the complex can be combined with bis(2-ethyl-1-hexylamine) copper (II) formate to yield an ink with good film forming properties, short sintering times and low decomposition temperatures. Inks that combine pyridine-Cu(OOCH)$_2$ or piperidine-Cu(OOCH)$_2$ with alkylamine-Cu(OOCH)$_2$ generate copper films with high conductivity values (low resistivity values) while being produced in a lower temperature process.

REFERENCES

The contents of the entirety of each of which are incorporated by this reference.
CN 1071182. Hu G. (1993) Heat Sensitive Variable Colour Mimeograph. Apr. 21, 2993.
GB 1443099. Toyo Ink Mfg. Co. (1976) Phthalocyanine Pigment Composition. Jul. 21, 1076.
EP 0335237. BASF AG. (1989) Inks for Ink-jet Printing. Oct. 4, 1989.
U.S. Pat. No. 5,980,622. Byers G W. (1999) Magenta Dyes for Ink-jet Inks. Nov. 9, 1999.
U.S. Pat. No. 6,521,032. Lehmann et al. (2003) Magenta Inks Comprising Copper Complex Azo Dyes Based on 1-Naohthol-di- or tri-Sulfonic Acids. Feb. 18, 2003.
U.S. Pat. No. 6,770,122. Du Pont. (2004) Copper Deposition Using Copper Formate Complexes. Sep. 29, 2004.
U.S. Pat. No. 7,473,307. Song et al. (2009) Electroless Copper Plating Solution, Method of Producing the Same and Electro Less Copper Plating Method. Jan. 6, 2009.
U.S. Pat. No. 8,262,894. Xu et al. High Speed Copper Plating Bath. Sep. 11, 2012.
US 2008/178761. Tomotake et al. (2008) Method of Forming Metal Pattern, and Metal Salt Mixture. Jul. 31, 2008.
US 2014/349017. Abe T. (2014) Copper Film-forming Composition, and Method for Producing Cooper Film by Using the Composition. Nov. 27, 2014.
WO 2004/035691. Nippon Kayaku KK. (2004) Phthalocyanine Compound for Ink-jet Printing, Water-soluble Green Ink Composition Containing Such Compound and Coloring Substance Using Such Composition. Sep. 1, 2004.
WO 2006/093398. Inktec Co., Ltd. (2006) Conductive Inks and Manufacturing Method Thereof. Sep. 8, 2006.
JPH 10279868. Canon KK. (1998) Ink Containing Organometallic Compound, Electrode, Electron-emitting Element and Production of Image Former. Oct. 20, 1998.
JP 2000-136333. Dainichiseika Color Chem. (2000) Colored Composition for Color Filter, Production of Color Filter, and Color Filter Produced Thereby. May 16, 2000.
JP 2004-162110. Mitsubishi Paper Mills Ltd. (2004) Copper/Amine Composition. Jun. 10, 2004.
JP 2009-256218. Toray Industries. (2009) Copper Precursor Composition, and Method of Preparing Copper Film Using the Same. Nov. 5, 2009.
Araki T, Sugahara T, Jiu J, Nagao S, Nogi M, Koga H, Uchida H, Shinozaki K, Suganuma K. (2013) Cu Salt Ink Formulation for Printed Electronics using Photonic Sintering. *Langmuir.* 29(35), 11192-11197.

Choi Y-H, Lee J, Kim S J, Yeon D-H, Byun Y. (2012) Highly conductive polymer-decorated Cu electrode films printed on glass substrates with novel precursor-based inks and pastes. *J. Mater. Chem.* 22, 3624-3631.

Farraj Y, Grouchko M, Magdassi S. (2015) Self-reduction of a copper complex MOD ink for inkjet printing conductive patterns on plastics. *Chem. Comm.* 51, 1587-1590.

Hwang J, Kim S, Ayag K R, Kim H. (2014) Copper Electrode Material using Copper Formate-Bicarbonate Complex for Printed Electronics. *Bull. Korean Chem. Soc.* 35(1), 147-150.

Kim I, Kim Y, Woo K, Ryu E-H, Yon K-Y, Cao G, Moon J. (2013) Synthesis of oxidation-resistant core-shell copper nanoparticles. *RSC Adv.* 3, 15169-15177.

Lyons A M, Nakahara S, Marcus M A, Pearce E M, Waszczak J V. (1991) Preparation of copper poly(2-vinylpyridine) nanocomposites. *J. Phys Chem.* 95(3), 1098-1105.

Shin D-H, Woo S, Yem H, Cha M, Cho S, Kang M, Jeong S, Kim Y, Kang K, Piao Y. (2014) A Self-Reducible and Alcohol-Soluble Copper-Based Metal-Organic Decomposition Ink for Printed Electronics. *ACS Appl. Mater. Interfaces.* 6(5), 3312-3319.

Yabuki A, Arriffin N, Yanase M. (2011) Low-temperature synthesis of copper conductive film by thermal decomposition of copper-amine complexes. *Thin Solid Films.* 519, 6530-6533.

Yabuki A, Tanaka S. (2012) Electrically conductive copper film prepared at low temperature by thermal decomposition of copper amine complexes with various amines. *Mater. Res. Bull.* 47(12), 4107-4111.

Yabuki A, Tachibana Y, Fathona I W. (2014) Synthesis of copper conductive film by low-temperature thermal decomposition of copper-aminediol complexes under an air atmosphere. Mater. *Chem. & Phys.* 148(1-2), 299-304.

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A copper precursor composition comprising:
a first copper complex comprising an imine or a first cyclic amine coordinated to a first copper precursor compound,
the imine comprising a compound of Formula (I)

(I)

where $R_1$, $R_2$ and $R_3$ are the same or different and are H, $C_{1-8}$ alkyl, $C_{2-8}$ alkenyl, $C_{2-8}$ alkynyl, $C_{3-8}$ cycloalkyl, $C_{6-14}$ aryl, $C_{7-20}$ alkaryl, $C_{7-20}$ aralkyl, OH, O—$C_{1-8}$ alkyl, O—$C_{7-20}$ aralkyl, O—$C_{7-20}$ alkaryl, $CO_2$—($C_{1-8}$ alkyl), $SO_2$—($C_{1-8}$ alkyl) or SO—($C_{1-8}$ alkyl) or $R_1$ and $R_2$ taken together form a $C_3$-$C_8$ ring, with the proviso that at least one of $R_1$, $R_2$ and $R_3$ is not H,
the first cyclic amine comprising a 5-membered, 6-membered or 7-membered ring structure, 1 to 30 carbon atoms and 1 to 3 nitrogen atoms where at least one nitrogen atom is in the ring structure and available for coordination to copper; and,
a second copper complex comprising a primary amine or a second cyclic amine coordinated to a second copper precursor compound,
the primary amine comprising formula R—$NH_2$, where R is a $C_6$-$C_{12}$ unsubstituted alkyl group,
the second cyclic amine comprising a 5-membered, 6-membered or 7-membered ring structure, 1 to 30 carbon atoms and 1 to 3 nitrogen atoms where at least one nitrogen atom is in the ring structure and available for coordination to copper,
the second cyclic amine different from the first cyclic amine when the composition comprises both the first and second cyclic amines,
the copper precursor composition thermally degradable in about 10 min or less at a temperature of about 140° C. or less to produce a metallic copper film having a resistivity of about 200 μΩ·cm or less.

2. The composition according to claim 1, wherein the first copper complex comprises two imines or two cyclic amines.

3. The composition according to claim 1, wherein the first copper complex comprises a cyclic amine, and the cyclic amine comprises a 6-membered ring.

4. The composition according to claim 3, wherein the 6-membered ring is pyridine or piperidine.

5. The composition according to claim 4, wherein the pyridine or piperidine is substituted with one or more $C_{1-8}$ alkyl groups.

6. The composition according to claim 1, wherein the first and second copper precursor compounds comprise copper (II) ions and one or more carboxylate anions coordinated to the copper (II) ions.

7. The composition according to claim 6, wherein the one or more carboxylate anions are two formate groups.

8. The composition according to claim 1, wherein the second copper complex comprises two primary amines.

9. The composition according to claim 1, wherein the primary amine is octylamine or ethylhexylamine.

10. The composition according to claim 1, wherein the first copper complex is present in the composition in an amount of about 20-75% (w/w) based on total weight of the first and second copper complexes.

11. The composition according to claim 1, wherein:
the first copper complex comprises the first cyclic amine, the first cyclic amine comprising a 5-membered, 6-membered or 7-membered ring structure, 1 to 30 carbon atoms and 1 to 3 nitrogen atoms where at least one nitrogen atom is in the ring structure and available for coordination to copper; and,
the second copper complex comprises the primary amine.

12. The composition according to claim 11, wherein the time is 5 min or less.

13. A copper ink comprising the copper precursor composition as defined in claim 1 and a solvent.

14. The ink according to claim 13, wherein the copper precursor composition comprises 20-80 wt % of the ink based on total weight of the ink.

15. The ink according to claim 13 further comprising a binder.

16. A process for producing a metallic copper film comprising: depositing the copper ink as defined in claim 13 on a surface of a substrate; and, sintering the ink for about 10 min or less at a temperature of 140° C. or less to produce a metallic copper film.

17. The process according to claim 16, wherein the temperature is 125° C. or less.

18. The process according to claim 16, wherein the temperature is in a range of 100-130° C.

19. The process according to claim 16, wherein the time is 5 min or less.

20. The process according to 16, wherein pressure during sintering is 2 atm or less.

21. The process according to 16, wherein the ink is deposited on the substrate by inkjet, screen, roll-to-roll, flexography or gravure printing.

22. The process according to 16, wherein the substrate comprises a flexible plastic.

23. The process according to claim 22, wherein the flexible plastic comprises polyethylene terephthalate (PET), polyolefin, polyethylene naphthalate (PEN), polydimethylsiloxane (PDMS), polystyrene, polycarbonate, polyimide or glass-reinforced epoxy resin laminate.

* * * * *